US009704933B2

(12) United States Patent
Sato

(10) Patent No.: US 9,704,933 B2
(45) Date of Patent: Jul. 11, 2017

(54) ORGANIC ELECTROLUMINESCENT DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 104 days.

(21) Appl. No.: 14/704,670

(22) Filed: May 5, 2015

(65) Prior Publication Data

US 2015/0333292 A1 Nov. 19, 2015

(30) Foreign Application Priority Data

May 13, 2014 (JP) ................................ 2014-099756

(51) Int. Cl.
*H01L 51/52* (2006.01)
*H01L 27/32* (2006.01)
*H01L 51/00* (2006.01)

(52) U.S. Cl.
CPC ...... *H01L 27/3244* (2013.01); *H01L 51/0096* (2013.01); *H01L 51/5253* (2013.01); *H01L 2251/301* (2013.01); *Y02E 10/549* (2013.01)

(58) Field of Classification Search
CPC ......... H01L 27/32; H01L 51/56; H01L 27/15; H01L 51/5221; H01L 51/5237; H01L 51/5253; H01L 27/3248; H01L 29/7869; H01L 29/24; H01L 27/3258; H01L 29/786; H01L 27/3244; H01L 2251/301; H01L 51/0096; H01L 51/52; H01L 51/3248
USPC ...................................... 257/40, 359, 79, 81
See application file for complete search history.

(56) References Cited

U.S. PATENT DOCUMENTS

2002/0024096 A1* 2/2002 Yamazaki ............... H01L 27/32 257/359
2002/0030440 A1 3/2002 Yamazaki
2002/0113549 A1 8/2002 Yamazaki et al.
2003/0137325 A1* 7/2003 Yamazaki ............ H01L 27/322 327/80
2003/0183830 A1* 10/2003 Yamazaki ........... H01L 27/3258 257/90
2005/0001547 A1 1/2005 Yamazaki et al.
2005/0263775 A1* 12/2005 Ikeda .................. G09G 3/3291 257/79
2006/0006799 A1 1/2006 Yamazaki et al.
2006/0014465 A1 1/2006 Yamazaki
2007/0065995 A1* 3/2007 Arao .................. H01L 27/1214 438/149

(Continued)

FOREIGN PATENT DOCUMENTS

JP 2002-093586 A 3/2002
JP 2002-324667 A 11/2002

*Primary Examiner* — Alexander Oscar Williams
(74) *Attorney, Agent, or Firm* — Typha IP LLC

(57) ABSTRACT

In an organic electroluminescent device, deterioration of an organic material layer of an OLED due to moisture and the like from a surrounding material is effectively prevented. An OLED is provided with an organic material layer including a light emitting layer and is provided on a lower substrate. A first diamond-like carbon layer is provided between the lower substrate and the organic material layer and is at least arranged in a light emitting area in a surface along the lower substrate. A second diamond-like carbon layer is provided above the organic material layer and is at least arranged in the light emitting area.

10 Claims, 7 Drawing Sheets

40 86 120 100 102 104 112 122 122 160 112 110 92 60 88 84 80 70 90b 82 90a 94 96 110 72

40 46 160 112 104 102 122 110 96 92 88 84 80 70

(56) References Cited

U.S. PATENT DOCUMENTS

2010/0065840 A1* 3/2010 Yamazaki ............. G02F 1/1368 257/43
2010/0079425 A1* 4/2010 Yamazaki ........... H01L 27/1214 345/206
2011/0031491 A1* 2/2011 Yamazaki ......... G02F 1/136227 257/43
2011/0240990 A1* 10/2011 Yamazaki ........... H01L 29/7869 257/43
2011/0240991 A1* 10/2011 Yamazaki ........... H01L 29/7831 257/43
2011/0248260 A1* 10/2011 Yamazaki ......... H01L 29/78606 257/43
2015/0333111 A1* 11/2015 Sato .................... H01L 27/3246 257/40

* cited by examiner 40
150
152
154
112
110
92
88
84
80
70
72
64
122
110
112
104
102
100
96
94
90a
120
72
122
82
86
90b
154
62
60

40
160
112
110
92
88
84
80
70
72
122
122
112
104
102
100
120
86
110
96
94
90a
82
90b
60

40
160
112
110
96
92
88
84
80
70
72
122
104
102
100
94
90a
120
72
122
86
82
90b
48
50
52
164
162

ORGANIC ELECTROLUMINESCENT DEVICE

CROSS-REFERENCE TO RELATED APPLICATION

The present application claims priority from Japanese application JP2014-099756 filed on May 13, 2014, the content of which is hereby incorporated by reference into this application.

BACKGROUND OF THE INVENTION

1. Field of the Invention

The present invention relates to an organic electroluminescent device, such as an illumination device or a display device, including an organic electroluminescent element.

2. Description of the Related Art

An OLED (organic light emitting diode), that is, an organic electroluminescent element attracts attention as a thin and light-weight light emitting source, and an illumination device or a display device using the OLED is developed.

For example, an organic electroluminescence (EL) display device of a related art has a structure in which an element substrate formed with an OLED and the like and an opposite substrate formed with a color filter and the like are bonded to each other while a filling resin layer is sandwiched therebetween. In the element substrate, a structure of a thin film transistor (TFT) and the like is formed on a glass substrate or the like, and an interlayer insulating film is formed on the structure. Further, after the surface thereof is flattened by laminating a flattening film, a laminate structure of the OLED including an anode, an organic material layer, a cathode and the like is formed. A sealing film is laminated on the OLED layer. Since the characteristic of the organic material layer of the OLED is deteriorated by moisture, the sealing film has a moisture resistant function to protect the OLED from moisture included in the filling resin layer. For example, the sealing film is often made of silicon nitride (SiN) or the like.

Incidentally, diamond-like carbon (DLC) is known as a thin film material effective in blocking moisture.

SUMMARY OF THE INVENTION

Although the sealing film covering the surface of the element substrate blocks the moisture from the filling resin layer, there is a problem that the sealing film can not protect the OLED from moisture and the like existing in the element substrate. Specifically, a resin layer can be used as the flattening film or the like in the element substrate. A layer constituting the element substrate, such as the flattening film, is relatively thin, and the discharge of moisture and the like included in the resin layer in the element substrate is small as compared with the filling resin layer. However, in a long period, a material to cause deterioration of the OLED, such as the moisture and oxygen gas, may be gradually discharged.

The invention provides an organic electroluminescent device in which the deterioration of the OLED by this problem is suppressed. Besides, the invention provides an organic electroluminescent device capable of displaying a high quality image.

(1) According to an embodiment of the invention, an organic electroluminescent device includes a light emitting element provided with an organic material layer including a light emitting layer and provided on a substrate, a first diamond-like carbon layer provided between the substrate and the organic material layer and at least arranged in a light emitting area in a surface along the substrate, and a second diamond-like carbon layer provided above the organic material layer and at least arranged in the light emitting area.

(2) In the organic electroluminescent device according to (1), the light emitting element may include a lower electrode and an upper electrode between which the organic material layer is sandwiched and which apply an electric signal to the organic material layer, and the first diamond-like carbon layer may be arranged to contact a lower surface of the lower electrode.

(3) In the organic electroluminescent device according to (1), the light emitting element may include a lower electrode and an upper electrode between which the organic material layer is sandwiched and which apply an electric signal to the organic material layer, and the second diamond-like carbon layer may be arranged to contact an upper surface of the upper electrode.

(4) The organic electroluminescent device according to (1) to (3) may be an organic electroluminescence display device in which the light emitting element is provided in each of plural pixels two-dimensionally arranged in a display area, and each of the first diamond-like carbon layer and the second diamond-like carbon layer may be integrally provided over the plural pixels.

(5) In the organic electroluminescent device according to (4), the light emitting element may include an upper electrode integrally provided over the plural pixels on the organic material layer, and a lower electrode provided for each of the pixels under the organic material layer, and the second diamond-like carbon layer may have conductivity and may be arranged to contact an upper surface of the upper electrode.

(6) In the organic electroluminescent device according to (4), the first diamond-like carbon layer and the second diamond-like carbon layer may be closed in contact with each other at an outside of an edge of the display area or through another inorganic material.

DETAILED DESCRIPTION OF THE INVENTION

Figure 1:
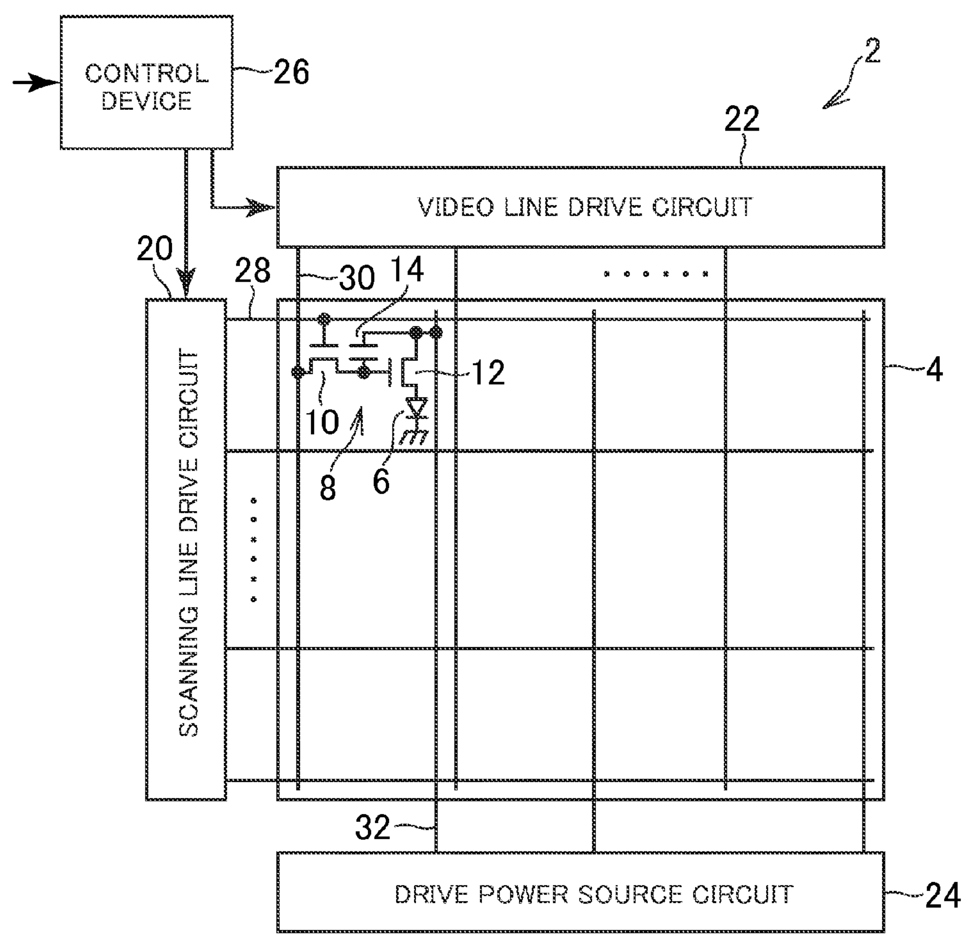
FIG. 1 is a schematic view showing a rough structure of an organic EL display device of a first embodiment of the invention.

Hereinafter, modes for carrying out the invention (hereinafter referred to as embodiments) will be described with reference to the drawings.

Incidentally, the disclosure is merely an example, and modifications, which maintain the gist of the invention and can be easily conceived by one of ordinary skill in the art, should fall within the scope of the invention. Besides, in the drawings, although widths, thicknesses, shapes and the like of respective parts are schematically shown as compared with actual forms in order to clarify the description, they are merely examples and do not restrict the interpretation of the invention. Besides, in the specification and the respective drawings, the same components as those described in previous drawings are denoted by the same reference numerals and a detailed description thereof is appropriately omitted.

An organic electroluminescent device of an embodiment of the invention is an organic EL display device. The organic EL display device is an active matrix display device, and is installed in a television, a personal computer, a portable terminal, a cellular phone or the like.

First Embodiment

FIG. 1 is a schematic view showing a rough structure of an organic EL display device 2 of a first embodiment. The organic EL display device 2 includes a pixel array part 4 for displaying an image, and a drive part for driving the pixel array part. The organic EL display device 2 is a flat panel display, and includes a display panel. The pixel array part 4 is provided on the display panel.

In the pixel array part 4, OLEDs 6 and pixel circuits 8 are arranged in a matrix form correspondingly to pixels. The pixel circuit 8 includes plural TFTs 10 and 12 and a capacitor 14.

On the other hand, the drive part includes a scanning line drive circuit 20, a video line drive circuit 22, a drive power source circuit 24 and a control device 26, and drives the pixel circuits 8 to control light emission of the OLEDs 6.

The scanning line drive circuit 20 is connected to scanning signal lines 28 provided for respective lines (pixel rows) of pixels in the horizontal direction. The scanning line drive circuit 20 selects the scanning signal lines 28 in order in accordance with a timing signal inputted from the control device 26, and applies a voltage for turning on the lighting TFT 10 to the selected scanning signal line 28.

The video line drive circuit 22 is connected to video signal lines 30 provided for respective lines (pixel columns) of the pixels in the vertical direction. The video line drive circuit 22 receives video signals from the control device 26, and outputs voltages corresponding to the video signals of the selected pixel row to the respective video signal lines 30 in accordance with the selection of the scanning signal line 28 by the scanning line drive circuit 20. The voltages are written in the capacitors 14 through the lighting TFTs 10 at the selected pixel row. The drive TFTs 12 supply currents corresponding to the written voltages to the OLEDs 6. By this, the OLEDs 6 of the pixels corresponding to the selected scanning signal line 28 emit light.

The drive power source circuit 24 is connected to drive power source lines 32 provided for the respective pixel columns, and supplies currents to the OLEDs 6 through the drive power source lines 32 and the drive TFTs 12 of the selected pixel row.

Here, a positive electrode (anode) of the OLED 6 is connected to the drive TFT 12. On the other hand, a negative electrode (cathode) of each of the OLEDs 6 is basically connected to ground potential, and the negative electrodes of the OLEDs 6 of all the pixels are constructed of a common electrode.

Figure 2:
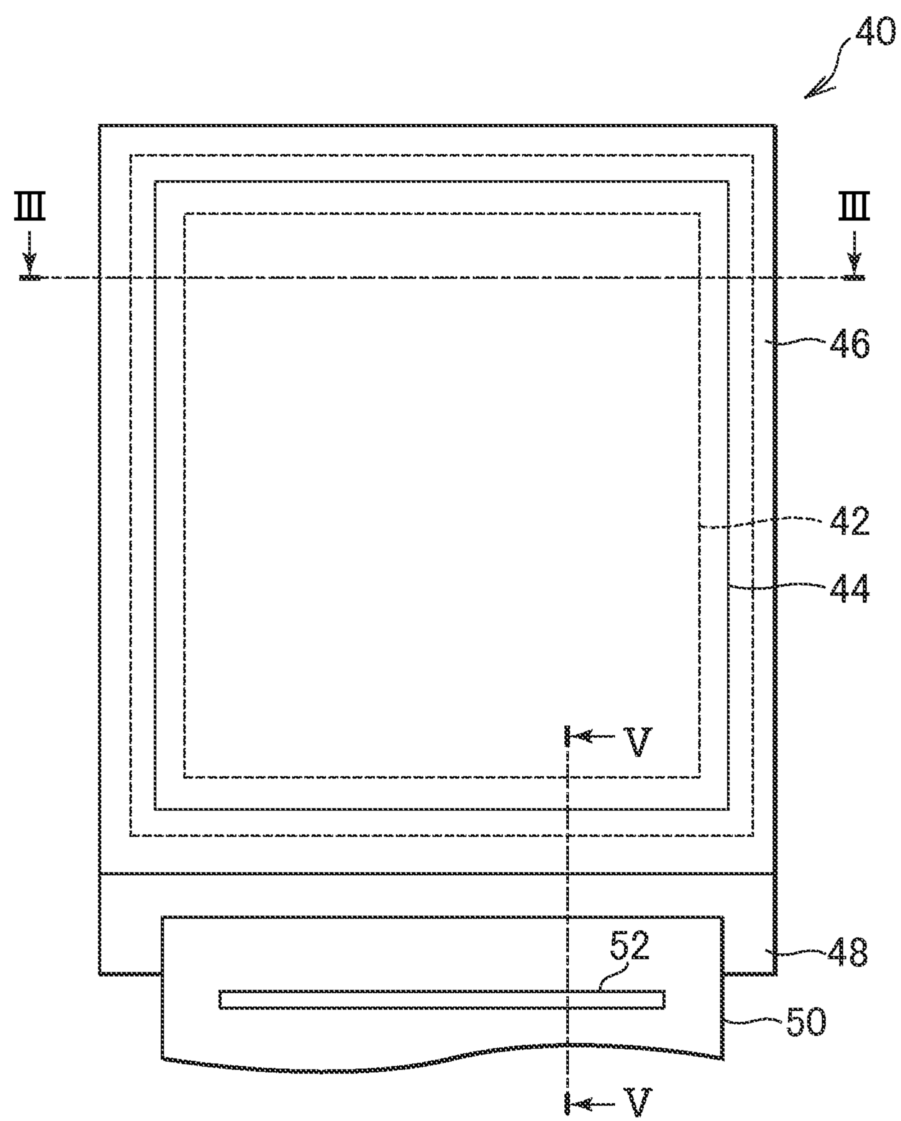
FIG. 2 is a schematic plan view of a display panel of the organic EL display device of the first embodiment of the invention.

FIG. 2 is a schematic plan view of a display panel 40 of the organic EL display device 2. The pixel array part 4 is arranged in a display area 42 of the display panel 40, and the OLEDs are arranged in the pixel array part 4 as described above. The cathode 44 constituting the OLED 6 is formed commonly to the respective pixels as described above, and covers the whole display area 42. As described later, an upper and a lower parts of the OLED 6 are covered with DLC films. The upper and the lower DLC films are adhered to each other in an surrounding area 46 of the pixel array part 4, and seal and protect the OLED 6 from external moisture, oxygen gas and the like.

A terminal area 48 to which wiring is drawn out from the pixel array part 4 is provided on one side of the rectangular display panel 40, and a flexible printed circuit (FPC) 50 is connected thereto. A driver IC 52 constituting the drive part is mounted on the FPC 50.

Figure 3:
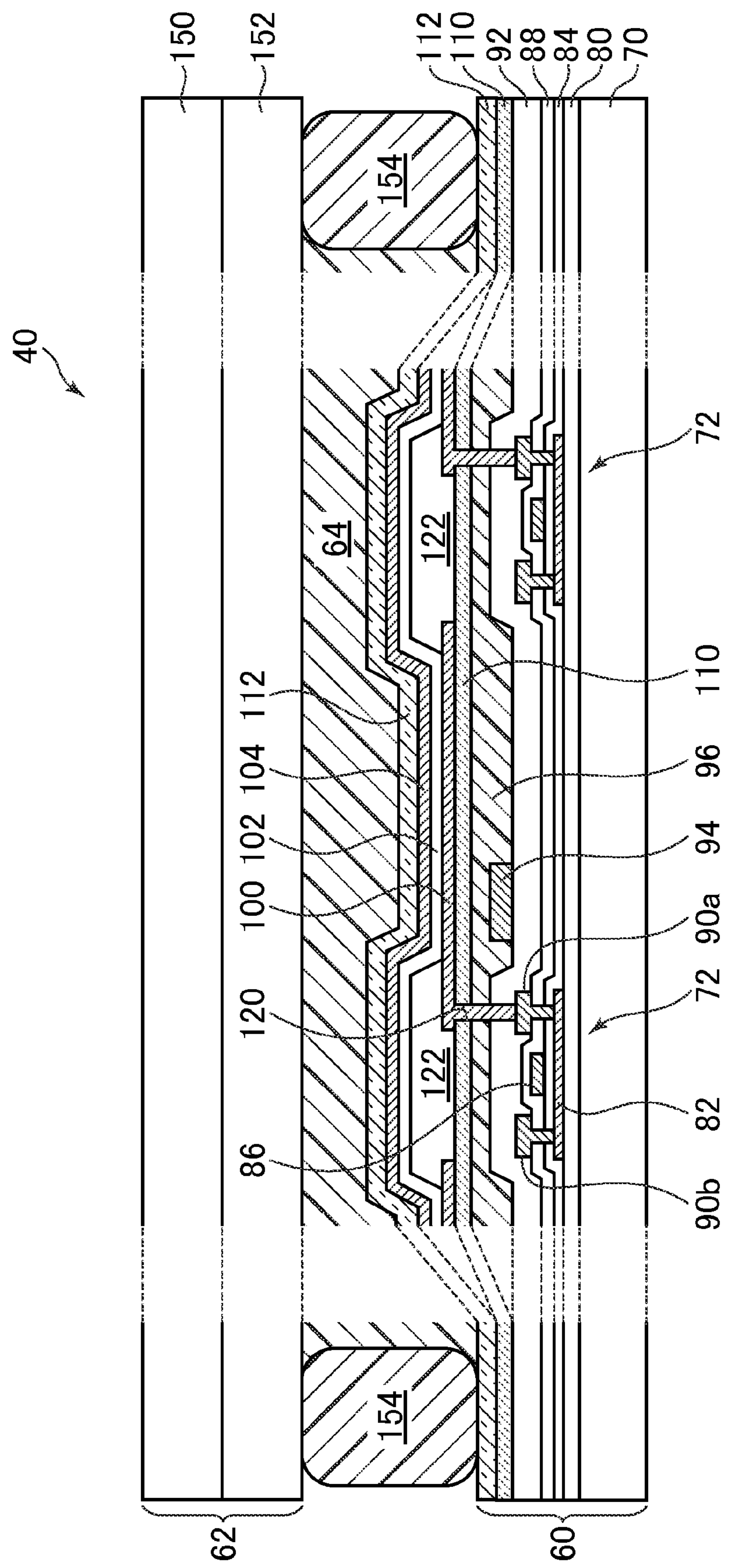
FIG. 3 is a schematic vertical sectional view of the display panel of the first embodiment of the invention at a position taken along line III-III shown in FIG. 2.

FIG. 3 is a schematic vertical sectional view of the display panel 40 at a position taken along line III-III shown in FIG. 2. The organic EL display device 2 has a structure in which an element substrate 60 and an opposite substrate 62 are bonded to each other through a filling material 64 therebetween. In this embodiment, the pixel array part is of a top emission type. The OLEDs 6 as light emitting elements are formed on the element substrate 60, and the light generated in the OLED 6 is emitted from the opposite substrate 62. That is, in FIG. 3, the light of the OLED is emitted upward. A coloring system in the organic EL display device 2 is, for example, a color filter system. The OLED generates white light, and the white light passes through color filters, so that lights of, for example, red (R), green (G) and blue (B) are formed.

The element substrate 60 is formed such that a circuit including TFTs 72 and the like, the OLEDs 6, and like are formed on a lower substrate 70 made of glass or resin film, by laminating and patterning various layers.

Specifically, a polysilicon (p-Si) layer is formed on the lower substrate 70 through a foundation layer 80 made of an inorganic insulating material such as silicon nitride (SiN) or silicon oxide (SiO), and a semiconductor region 82, which becomes a channel part, a source part and a drain part of the TFT 72, is formed of the p-Si layer.

After the semiconductor region 82 is formed, a gate insulating film 84 is laminated. The gate insulating film 84 is made of, for example, SiO, and can be formed by chemical vapor deposition (CVD). A gate electrode 86 is arranged above the channel part of the TFT 72 in the semiconductor region 82 through the gate insulating film 84. The gate electrode 86 is formed by patterning a metal film formed by sputtering or the like. Thereafter, an interlayer insulating film 88 covering the gate electrode 86 is laminated. The interlayer insulating film 88 is formed by, for example, laminating SiN or SiO by the CVD method.

A contact hole passing through the interlayer insulating film 88 and the gate insulating film 84 and reaching each of the source part and the drain part of the semiconductor region 82 is formed, and a metal film is formed in the contact hole and on the interlayer insulating film 88 by sputtering. The metal film is patterned, so that a wiring, a source electrode 90*a* and a drain electrode 90*b* of the TFT 72, and the like are formed.

After the TFT 72 is formed in this way, an interlayer insulating film 92 is laminated. The interlayer insulating film 92 is formed by, for example, laminating SiN or SiO by the CVD method.

A wiring 94 and the like can be formed on the surface of the interlayer insulating film 92 by patterning the metal film formed by sputtering or the like. For example, the scanning signal line 28, the video signal line 30, and the drive power source line 32 can be formed in multi-layer structure by the metal film and the metal film used for the formation of the gate electrode 86.

A flattening film 96 is formed thereon by laminating, for example, an organic material such as acryl resin, and the OLED 6 is formed on the surface of the display area 42 flattened by this. The OLED 6 includes a lower electrode 100, an organic material layer 102 and an upper electrode 104. The lower electrode 100, the organic material layer 102 and the upper electrode 104 are sequentially laminated from the lower substrate 70 side. In the embodiment, the lower electrode 100 is the positive electrode (anode) of the OLED, and the upper electrode 104 is the negative electrode (cathode). The organic material layer 102 includes a hole transport layer, a light emitting layer, and an electron transport layer.

The organic EL display device 2 includes, as one of features, a first DLC layer 110 formed between the lower substrate 70 which is the foundation of the OLED and the organic material layer 102, and a second DLC layer 112 formed above the organic material layer 102. The DLC layers 110 and 112 are, at least, arranged in the pixel array part 4 which becomes the light emitting area in the display panel 40. In the embodiment, the DLC layers 110 and 112 extend up to the area 46 around the pixel array part 4. In the embodiment, the DLC layer 110 is arranged at a position in contact with the lower surface of the lower electrode 100 in the laminate structure of the element substrate 60. For example, the DLC layer 110 is laminated on the flattening film 96, and the lower electrode 100 is formed on the surface thereof. Besides, the DLC layer 112 can be laminated in contact with the upper surface of the upper electrode 104.

A structure above the flattening film 96 in the element substrate 60 will be described in more detail. The DLC layer 110 is formed on the surface of the flattening film 96 by, for example, a plasma CVD method. The DLC layer 110 is formed so as to have a characteristic to prevent moisture or the like discharged from a layer lower than the DLC layer 110, such as the flattening film 96, from reaching the organic material layer 102 of the OLED 6. For example, as the organic material layer constituting the flattening film 96 becomes thick, the amount of discharged moisture becomes large. Thus, the thickness of the DLC layer 110 can be set according to the thickness of the flattening film 96. Besides, the DLC layer 110 has insulation properties in order to prevent short-circuit between the lower electrodes 100 separately formed on the surface thereof for the respective pixels.

After the DLC layer 110 is formed, a contact hole 120 for connecting the lower electrode 100 to the TFT 72 is formed. If the TFT 72 shown in FIG. 3 is the drive TFT 12 having an n-channel, the lower electrode 100 is connected to the source electrode 90*a* of the TFT 72. Specifically, the contact hole 120 reaching the source electrode 90*a* is formed in the DLC layer 110, the flattening film 96 and the interlayer insulating film 92. A conductor film is formed on the surface of the DLC layer 110 and in the contact hole 120, and this is patterned so that the lower electrode 100 electrically connected to the source electrode 90*a* through the contact hole 120 is formed for each pixel.

The lower electrode 100 can be made of a transparent electrode material such as indium tin oxide (ITO), for example. The ITO film can be formed by a reactive sputtering method using Ar+$O_2$ mixture gas. Besides, the lower electrode 100 can also be formed by using another transparent electrode material, for example, indium zinc oxide (IZO), tin oxide, zinc oxide, indium oxide, or aluminum oxide complex oxide.

Incidentally, the organic EL display device 2 of the embodiment is of the top emission type as described above, and the lower electrode 100 can be made a two-layer structure in which a transparent conductive film is laminated on a reflection layer made of a material having high reflectivity. For example, the reflection layer can be made of aluminum (Al) or silver (Ag), and reflects the light from the light emitting layer to the display surface, that is, to the opposite substrate 62 side.

After the lower electrode 100 is formed, a bank 122 is formed on a pixel boundary. The lower electrode 100 is exposed in an effective area of a pixel surrounded by the bank 122. The bank 122 is preferably made of an inorganic material in which moisture and oxygen gas are hard to be discharged. Besides, when the bank is made of an organic material, before the organic material layer 102 of the OLED 6 is formed, moisture and oxygen gas in the bank 122 are preferably sufficiently reduced by, for example, bake processing in vacuum. When the bank 122 is made of the organic material, moisture and oxygen gas are sufficiently reduced by the bake processing. Thus, the amount of moisture and oxygen gas per unit volume in the bank 122 is smaller than the amount of moisture and oxygen gas included in the flattening film 96.

After the bank 122 is formed, the respective layers constituting the organic material layer 102 are sequentially laminated on the lower electrode 100. The upper electrode 104 is formed by using a transparent electrode material on the organic material layer 102. For example, as the upper electrode 104, a film of IZO is formed by the reactive sputtering method using Ar+$O_2$ mixture gas.

The DLC layer 112 is formed on the surface of the upper electrode 104 by, for example, a plasma CVD method. The DLC layer 112 is formed so as to have a characteristic to prevent moisture and the like discharged from the filling material 64 from reaching the organic material layer 102 of the OLED 6. For example, the thickness of the DLC layer 112 can be set according to the thickness of the filling material 64. Here, since the flattening film 96 can be thinner than the filling material 64, the DLC layer 110 can be made relatively thin, while the DLC layer 112 can be set relatively thick.

The upper electrode 104 is a common electrode integrally formed over the plural pixels constituting the pixel array part 4. The DLC layer 112 arranged to contact the upper electrode 104 is made conductive, so that the DLC layer 112 can be made to function as an auxiliary wiring of the upper electrode 104. By this, potential drop in the upper electrode 104 is reduced, and variation in light emission intensity according to the position of a pixel in the display area 42 is suppressed. Accordingly, the picture quality can be improved. For example, nitrogen is introduced as an impurity, so that the DLC layer 112 has conductivity.

In the above, the structure of the element substrate 60 is described. In the display area 42, the DLC layers 110 and 112 arranged to sandwich the OLED 6 therebetween extend up to the outside area 46 of the display area 42, and the two DLC layers 110 and 112 contact each other in the area 46 and are closed. By this, intrusion of moisture and oxygen gas through a gap between the two DLC layers 110 and 112 into the organic material layer 102 is suppressed, and the deterioration of the organic material layer 102 is prevented.

In the opposite substrate 62, a laminate structure 152 including a black matrix, a color filter, and an overcoat layer is formed on a surface of an upper substrate 150 made of a transparent material such as glass.

The element substrate 60 and the opposite substrate 62 are oppositely arranged while a gap is provided therebetween. A dam material (seal material) 154 is disposed in the gap to surround the display area, and hermetically seals the gap between the element substrate 60 and the opposite substrate 62. The filling material 64 is filled in the gap inside the dam material 154. The filling material 64 and the dam material 154 are hardened, and then both the substrates are bonded to each other.

Second Embodiment

The display panel 40 of the first embodiment has the structure in which the element substrate 60 and the opposite substrate 62 are bonded to each other. On the other hand, a display panel 40 of an organic EL display device 2 of a second embodiment has a structure in which the opposite substrate 62 is not provided. Hereinafter, differences from the first embodiment will be mainly described.

Figure 4:
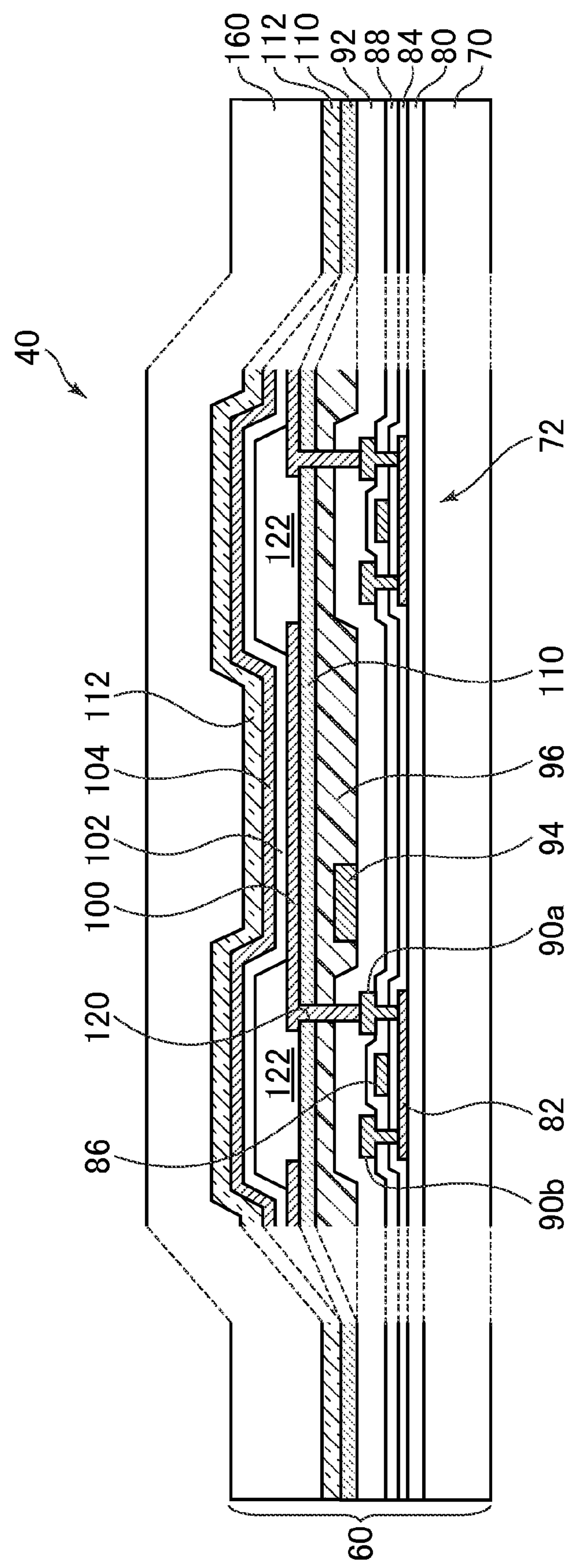
FIG. 4 is a schematic vertical sectional view of a display panel of a second embodiment of the invention at the position taken along line III-III shown in FIG. 2.

A rough structure of the organic EL display device 2 of the second embodiment and a plan view of the display panel 40 are common to FIG. 1 and FIG. 2 described in the first embodiment. FIG. 4 is a schematic vertical sectional view of the display panel 40 of the second embodiment, and shows a section at the position taken along line III-III shown in FIG. 2 similarly to FIG. 3. A laminate structure from a lower substrate 70 to a DLC layer 112 is the same as that of the first embodiment. That is, an OLED 6 is sandwiched between a DLC layer 110 and the DLC layer 112, and is protected from moisture and oxygen gas from the outside.

In order to secure the mechanical strength of a surface of an element substrate 60, a protection film 160 is laminated on a surface of the DLC layer 112 in the structure shown in FIG. 4.

The protection film 160 may have a single-layer structure or a multi-layer structure. For example, the protection film 160 can be made to have a laminate structure of an inorganic film and an organic film. Specifically, the structure is made to include two layers of SiN films and an acryl film sandwiched therebetween, and a defect which may be generated in the SiN film by a foreign material can be compensated by the acryl film.

Figure 5:
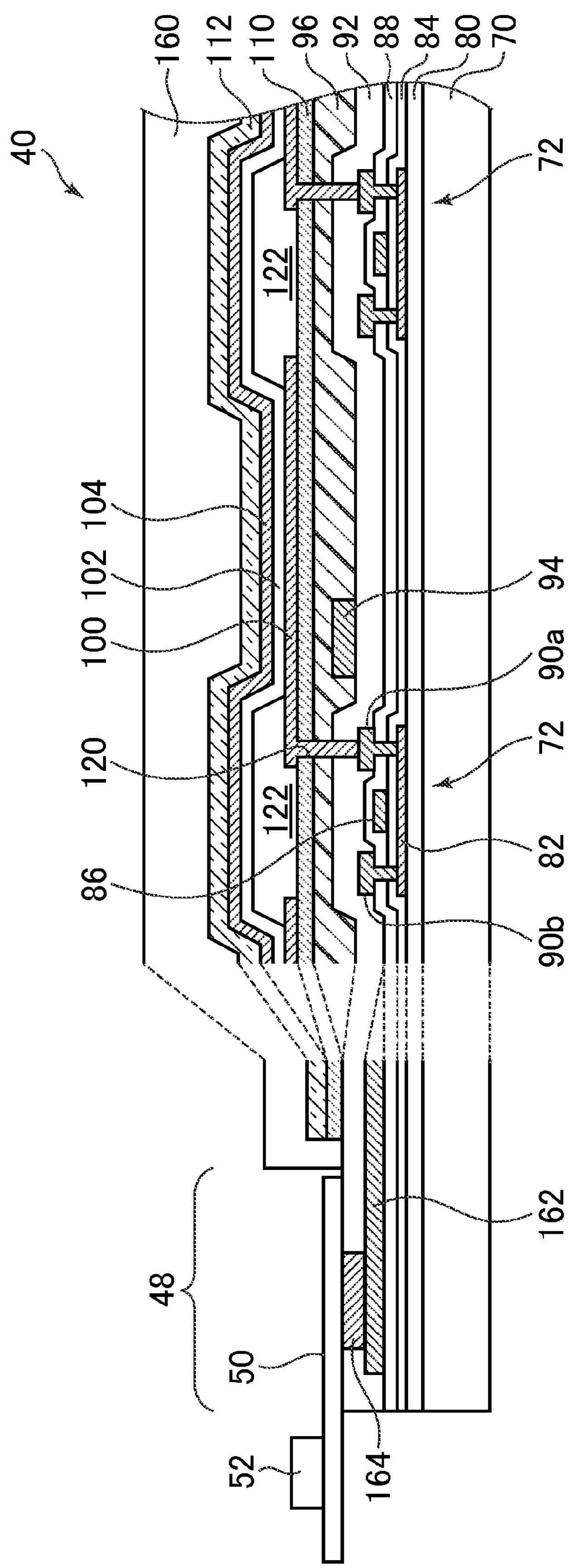
FIG. 5 is a schematic vertical sectional view of the display panel of the second embodiment of the invention at a position taken along line V-V shown in FIG. 2.

FIG. 5 is a schematic vertical sectional view of the display panel 40 at a position taken along line V-V of FIG. 2. This drawing shows a connection structure of a circuit provided in a display area 42 and an FPC 50. For example, a wiring 162 is formed of the same metal film as a source electrode **90*a* and a drain electrode 90*b* of a TFT 72, and is drawn out from the display area 42 to a terminal area 48. The FPC 50 is bonded to the terminal area 48 of the display panel 40 by using an anisotropic conductive film (AFC) 164, and electrical connection between the wiring of the FPC 50 and the wiring 162 is performed by the AFC 164. Incidentally, connection of the FPC 50 to the display panel 40** in the first embodiment can also be performed by the same structure.

Modified Examples (1) The DLC layers 110 and 112 are for mainly protecting the organic material layer 102 from moisture and the like. Here, the position of the DLC layers 110 and 112 in the laminate structure of the element substrate 60 can be made another position where the organic material layer 102 is sandwiched therebetween.

For example, an inorganic insulating film of SiN or the like may exist between the DLC layer 110 and the lower electrode 100. Similarly, an inorganic insulating film of SiN or the like may exist between the DLC layer 112 and the upper electrode 104.

Figure 6:
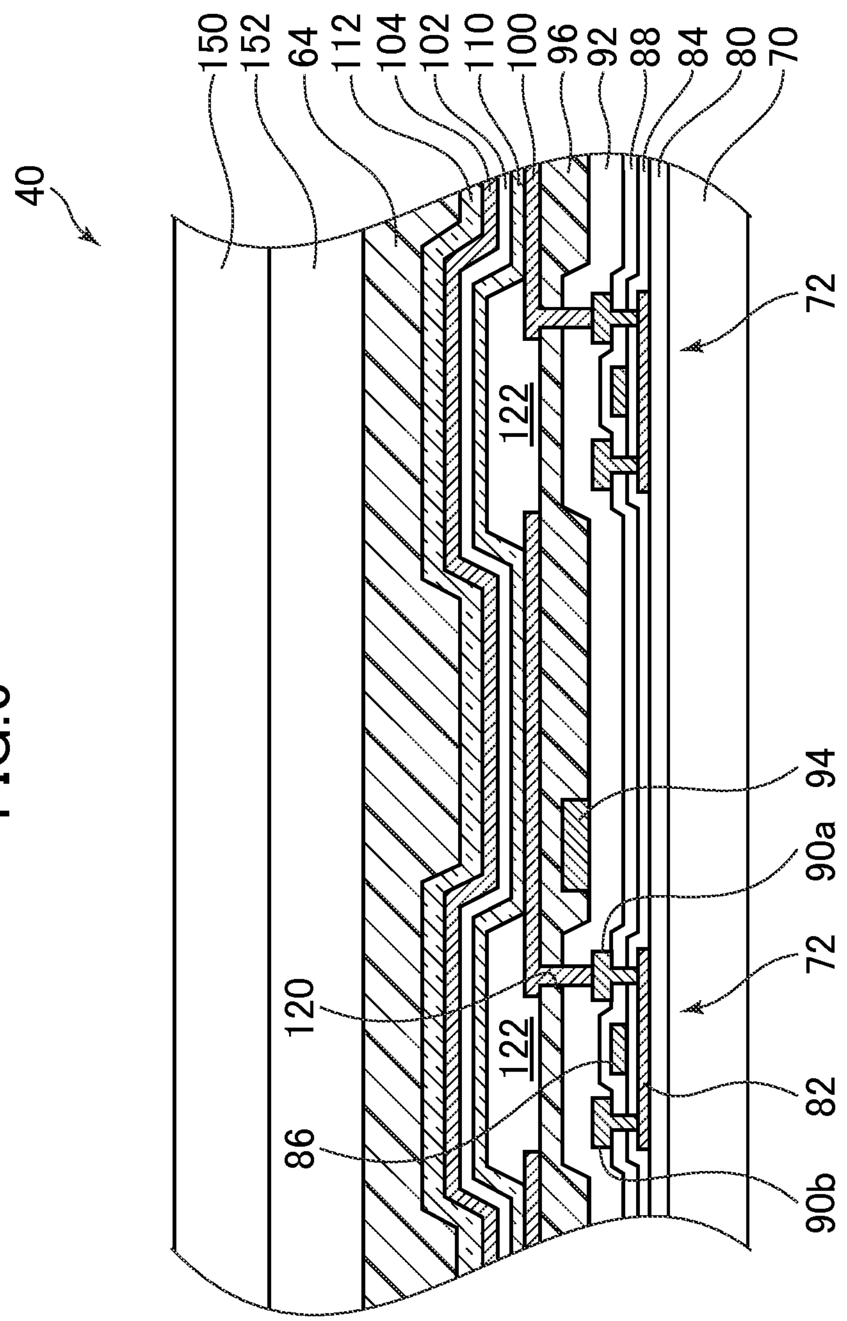
FIG. 6 is a schematic vertical sectional view of a pixel array part of a modified example of the invention.

(2) A structure can also be made such that the DLC layer 110 having conductivity is arranged between the lower electrode 100 and the organic material layer 102. FIG. 6 is a schematic vertical sectional view of a pixel array part 4 having the structure. Since the DLC layer 110 can be arranged on a bank 122, that is, between the bank 122 and an organic material layer 102, when the bank 122 is made of an organic material, the DLC layer 110 can protect the organic material layer 102 from moisture and the like discharged by the bank 122. Here, conductivity $\sigma$ of the DLC layer 110 is set so that the operation of an OLED 6 in each pixel is enabled, and the operations of the OLEDs 6 in adjacent pixels are not influenced. Specifically, since thickness $\lambda_T$ of the DLC layer 110 can be made relatively thin, the value $(\lambda_G/\lambda_T)$ of the ratio of a distance $\lambda_G$ between the adjacent lower electrodes 100 to the thickness of the DLC layer 110 becomes relatively large. Then, the conductivity $\sigma$ is adjusted so that the electric resistance of the DLC layer 110 between the pixels is secured, and current supply from the lower electrode 100 to the organic material layer 102 through the DLC layer 110 is enabled in each pixel. Besides, the so-called anisotropic conductivity may be provided in which the conductivity $\sigma$ is different between a film thickness direction and a film surface direction. For realizing those, it is effective that fine alignment treatment is applied to the DLC layer surface by UV light or the like, or nitrogen or the like is doped into an area including a part or whole of the light emitting area by using ion implantation. In these structures, there is also an effect that adhesion of the OLED is improved. Thus, the problem of film peeling of an OLED layer caused by concentration of stress to an interface in a flexible display or the like can be greatly improved.

(3) In the foregoing embodiment, the structure is described in which the DLC layer 110 and the DLC layer 112 contact each other in the outside area 46 of the display area 42, so that the OLED 6 is sealed in the DLC films. As a modified example of the sealing structure, a structure may be made such that in the area 46, the DLC layer 110 and the DLC layer 112 are closed through another inorganic material intervening therebetween.

Figure 7:
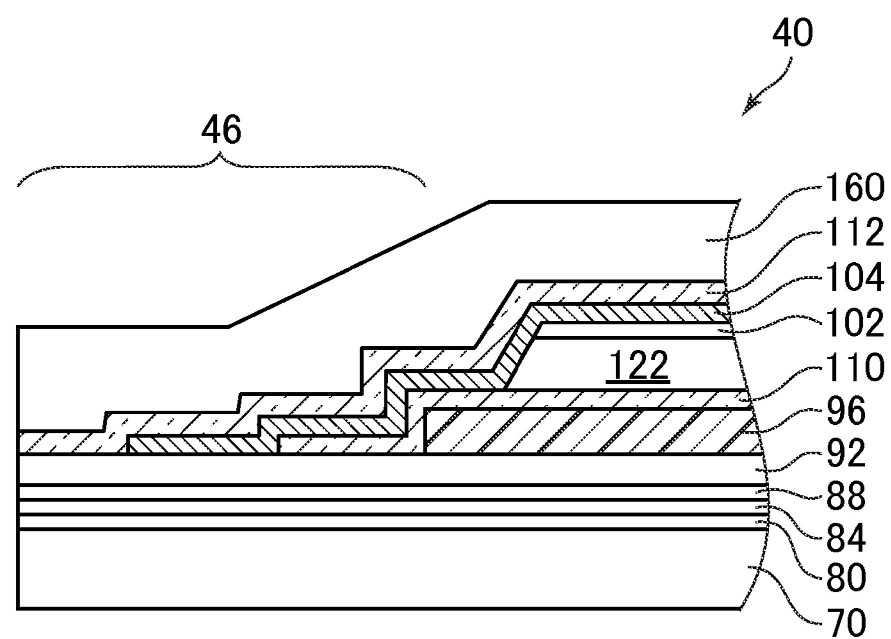
FIG. 7 is a schematic vertical sectional view of a display panel of a modified example of the invention.

FIG. 7 is a schematic vertical sectional view of a display panel 40 showing an example of the modified example of the sealing structure, and is a partial sectional view of an area 46 at an end part of the display panel 40 in which the opposite substrate 62 is not provided. A flattening film 96 is basically provided in a display area 42, and the flattening film 96 may not be provided in an area outside the display area, in which the OLED 6 is not formed. In the structure of FIG. 7, although an interlayer insulating film 92 made of an inorganic material is formed up to the area 46, the flattening film 96 is not formed in the area 46. A lower DLC film 110 covers the surface of the flattening film 96, and its edge contacts the interlayer insulating film 92 at the outside of the flattening film 96. The edge of the DLC film 110 is covered with, for example, an upper electrode 104, and a DLC layer 112 contacts the interlayer insulating film 92 at the outside of an edge of the upper electrode 104. In this structure, a portion between a position where the DLC layer 110 contacts the interlayer insulating film 92 and a position where the DLC layer 112 contacts the interlayer insulating film 92 is closed by the interlayer insulating film 92. That is, the DLC layers 110 and 112 and the interlayer insulating film 92 in the area 46 form a sealing structure to block intrusion of moisture and the like from the filling material 64 or the flattening film 96 into the OLED 6.

According to the invention clarified by the foregoing respective embodiments and modified examples, the sealing structure to enclose the organic material layer 102 of the OLED 6 is basically formed of the DLC layers 110 and 112, and the organic material layer 102 can be protected from deterioration due to moisture and the like. The DLC layers 110 and 112 are arranged so that as small amount of material, which becomes a discharge source of moisture and the like, as possible is contained in the inside of the sealing structure formed by those. By this, the OLED 6 can be effectively protected from deterioration.

In the above embodiments and modified examples, the image display device is exemplified as the disclosed example of the organic electroluminescent device. However, the invention can be applied also to an illumination device as another application example.

One of ordinary skill in the art can conceive various modifications and corrections in the scope of conception of the invention, and it is understood that the modifications and corrections also fall within the scope of the invention. For example, those obtained by addition or deletion of components, or design change or by addition or deletion of steps, or change in condition on the foregoing embodiments by one of ordinary skill in the art are also contained in the scope of the invention as long as the gist of the invention is included.

Of other functions and advantages brought about from the modes described in the embodiments, those apparent from the description of the specification or appropriately conceived by ordinary skill in the art are to be naturally construed as being brought about by the invention.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic display device comprising:
a substrate;
a first layer which is formed on the substrate and includes a TFT and a plurality of inorganic insulation film;
a first organic film on the first layer;
a first diamond-like carbon layer on the first organic film;
an organic light emitting element on the first diamond-like carbon layer;
a second diamond-like carbon layer on the organic light emitting element; and
a passivation film which is formed on the second diamond-like carbon layer and includes a first compound film made of silicon and nitride.

2. The organic display device according to claim 1,
wherein the organic light emitting element includes:
an anode;
an organic layer which is formed on the anode and includes an organic light emitting layer; and
a cathode on the organic layer, and
wherein the anode is in contact with the first diamond-like carbon layer.

3. The organic display device according to claim 1,
wherein a first thickness of the first diamond-like carbon layer is thinner than a second thickness of the second diamond-like carbon layer, and
wherein the second thickness is thinner than a third thickness of the passivation film.

4. The organic display device according to claim 1, wherein a first distance between an edge portion of the substrate and an edge portion of the first organic film is longer than a second distance between the edge portion of the substrate and an edge portion of the first diamond-like carbon layer, and
the first distance is longer than a third distance between the edge portion of the substrate and an edge portion of the second diamond-like carbon layer.

5. The organic display device according to claim 4, further comprising a bank insulation layer, wherein
the organic light emitting element includes: an anode; an organic layer which is formed on the anode and includes an organic light emitting layer; and a cathode on the organic layer,
the bank insulation layer is formed between the anode and the organic light emitting layer, covers an edge portion of the anode, exposes a part of the anode, and is made of an organic material,
a fourth distance between the edge portion of the substrate and an edge portion of the bank insulation layer is longer than the second distance, and
the fourth distance is longer than the third distance.

6. The organic display device according to claim 5, having a display region including the organic light emitting element and a peripheral region surrounding the display region, wherein
a sealing structure is formed in the peripheral region by laminating the first diamond-like carbon layer and the second diamond-like carbon layer in this order without holding an organic material between them.

7. The organic display device according to claim 6, wherein the first diamond-like carbon layer, the cathode, and the second diamond-like carbon layer are laminated in this order the sealing structure.

8. The organic display device according to claim 6, wherein the first diamond-like carbon layer is in contact with the second diamond-like carbon layer in the sealing structure.

9. The organic display device according to claim 7, wherein
a fifth distance between the edge portion of the substrate and an edge portion of the cathode is shorter the second distance, and
the fifth distance is longer than the third distance.

10. The organic display device according to claim 7, wherein the passivation film includes:
a resin material on the first compound film; and
a second compound film made of silicon and nitride on the resin material.

* * * * *